United States Patent [19]
Nixon

[11] Patent Number: 4,804,851
[45] Date of Patent: Feb. 14, 1989

[54] CHARGED PARTICLE SOURCES

[75] Inventor: William C. Nixon, Cambridge, England

[73] Assignee: Texas Instruments Incorporated, Dallas, Tex.

[21] Appl. No.: 83,867

[22] Filed: Aug. 7, 1987

Related U.S. Application Data

[63] Continuation of Ser. No. 745,351, Jun. 14, 1985.

[30] Foreign Application Priority Data

Jun. 19, 1984 [GB] United Kingdom ............... 8415623

[51] Int. Cl.⁴ .......................................... H01J 37/302
[52] U.S. Cl. .................................. 250/492.2; 250/398
[58] Field of Search ............... 250/423 R, 396 R, 398, 250/492.22, 492.23, 492.2, 396 ML

[56] References Cited

U.S. PATENT DOCUMENTS

| 3,621,327 | 11/1971 | Hashmi | 250/396 |
|---|---|---|---|
| 4,051,381 | 9/1977 | Trotel | 250/492.23 |
| 4,121,130 | 10/1978 | Gange | 313/302 |
| 4,130,761 | 12/1978 | Matsuda | 250/398 |
| 4,153,843 | 5/1979 | Pease | 250/396 R |
| 4,472,636 | 9/1984 | Hahn | 250/398 |
| 4,577,111 | 3/1986 | Saitou et al. | 250/492.23 |

FOREIGN PATENT DOCUMENTS

| 432485 | 7/1935 | United Kingdom . |
|---|---|---|
| 1214398 | 12/1970 | United Kingdom . |
| 2116358 | 9/1983 | United Kingdom ............ 250/396 R |

OTHER PUBLICATIONS

Pfeiffer, Hans C., "Recent Advances in Electron Beam Lithography for the High Volume Production of VLSI Devices," IEEE Trans. on Elec. Devices, vol. ED-26, No. 4, Apr. 79.

Primary Examiner—Bruce C. Anderson
Assistant Examiner—Paul A. Guss
Attorney, Agent, or Firm—N. Rhys Merrett; Gary C. Honeycutt; Melvin Sharp

[57] ABSTRACT

Charged particles from a line emitter are focussed as a line image on a means for selectively blocking part of the image to produce a flat beam of controllable length. The blocking means may be an apertured plate with means for rotating and/or translating the image relative to the aperture to produce the required beam length. After passage through the aperture the beam may be twisted and/or translated to its original or some other orientation and position. The beam may be of electrons or ions and may be used in the manufacture or testing of integrated circuits. An alternative form of blocking means is a row of controllable gate electrodes which can block selected parts of the line beam; this is of particular value in producing c.r.t. displays.

39 Claims, 5 Drawing Sheets

CHARGED PARTICLE SOURCES

This application is a continuation of application Ser. No. 745,351, filed June 14, 1985.

This invention relates to charged particle sources, especially sources of electrons or ions.

It has been proposed to use electron beam exposure of a resist in the manufacture of discrete semiconductor devices and integrated circuits because the wavelength of light sets a limit to the resolution obtainable when the light is used to activate the resist, and, even when ultraviolet light is used, adequate resolution for the manufacture of high-speed or high-frequency devices or circuits cannot be obtained by optical activation of the resist. The required selective exposure of the resist to electron bombardment can be obtained either by masking the resist and flooding the area with electrons or by deflecting a narrow beam in zig-zags or meanders (both vector scan and raster scan) over the parts of the resist area to be exposed. In the latter method it is necessary to use a narrow beam to obtain a sharply defined edge at the boundary of the exposed parts and also to provide the required high intensity of electron bombardment. The complexity of the path to be described by the beam means that it takes an undesirably long period of time to describe.

The manufacture of integrated circuits and discrete semiconductor devices can involve the use of ion beams to implant impurities in selected areas as an alternative to diffusion techniques, and such ion beam implantation has been effected by placing an ion blocking mask on the semiconductor wafer and then bombarding it with a flood of ions. As an alternative, a focussed ion beam can be deflected to cause the impurities to be implanted in the required regions of the wafer without the need to use a mask. As with an electron beam, it is necessary to use a narrow beam to obtain the edge definition and consequently the beam must be zig-zagged or meandered to fill areas. This means that a relatively long period of time is needed to describe the locus required of the beam, so that the process is correspondingly expensive as with electron beam exposure of a resist.

Another problem can arise in the production of very high resolution cathode ray tube displays. A cathode ray display tube uses a finely focussed beam of electrons deflected over a phosphor screen to produce the display. A conventional television display has a raster of 625 lines per frame with 25 frames per second, so that a video signal of a bandwidth of 6 MHz can produce about 350 picture elements per line, allowing 10% for the line flyback. When cathode ray tubes are used for displaying the output of computers, for example, in the form of drawings, a raster of say 2000 lines per frame may be required with 3000 picture elements per line. A frame rate of 25 per second is needed with interlacing to avoid visible flickering of the display which means that the video signal should have a bandwidth of 165 MHz. Such a display would require a very finely focussed electron beam of sufficiently high intensity to excite the phosphor adequately in the 6 nanoseconds available to define a picture element. This is very difficult to achieve in practice so as to produce a bright display.

It is an object of the present invention to provide a source of charged particles for alleviating at least partially the difficulties described above, in both vector scan and raster scan systems.

According to the present invention there is provided a source of charged particles including a line emitter for emitting the charged particles, means for forming the emitted particles into a flat beam and means responsive to an applied electrical signal to block selectively one or more parts of the beam.

The blocking means may take the form of an aperture in a material impenetrable to the beam with electrostatic or electromagnetic focussing and/or deflecting means effective to change the orientation and/or position of a line image of the emitter relative to the aperture in response to the applied electrical signal. After passage through the aperture, the unblocked part of the beam may be returned to a datum orientation and position and then further rotated and/or translated to a required orientation and/or position. Alternatively the final rotation and/or translation may make allowance for changes in orientation and/or position of the line image relative to the aperture arising from the beam shaping at the aperture. If the changes to the line image affect its orientation only, for example by the use of two electromagnetic lenses of opposite polarity having the same combined strength but of adjustable relative strengths, the aperture may take the form of a narrow slit or a slit with a skew symmetrical spiral or stepped spiral periphery. Alternatively, if the changes to the line image affect only its position, the aperture may be trapezoidal with straight or stepped non-parallel sides. Apertures of other shapes may be used when the line image is subjected to combinations of rotation and translation. Several separate apertures may be provided instead of a single aperture.

The blocking means may alternatively include a row of discrete grid or gate electrodes effective to block the passage of different parts of the beam.

The line emitter may take the form of a narrow heated strip of an electron-emitting material such as lanthanum hexaboride provided as a coating on an electric filament. Alternatively, the line emitter may be a block of single crystal lanthanum hexaboride having a suitable crystallographic orientation and shaped to have an edge at which the electron emission occurs. In another example, the line emitter may emit ions, being constructed as a narrow angle wedge with a powerful electric field in the vicinity of the edge of the wedge to draw ions therefrom.

A source according to the invention may be used for electron beam inspection of integrated circuits, for making masks for the manufacture of such circuits, or for directly writing on the semiconductor wafer using an ion beam. Annealing of semiconductor material and the welding of connections to an integrated circuit can also be performed using an electron beam of sufficient power. Thus sources according to the invention could make possible single station processing of semiconductor wafers for integrated circuit production.

In order that the invention may be fully understood and readily carried into effect, it will now be described with reference to examples shown in the accompanying drawings, of which.

Figure 1:
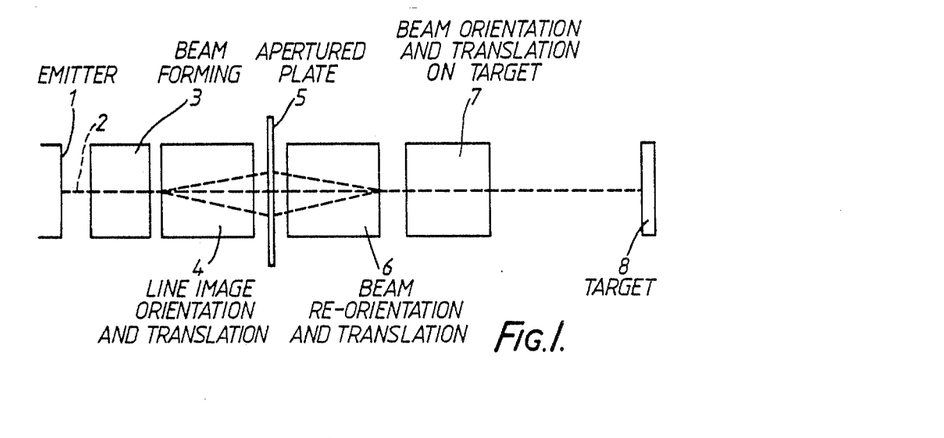
FIG. 1 is a diagram of one example of a source according to the invention.

The example of the invention shown in FIG. 1 has a line emitter 1 from which a beam of charged particles represented by the dotted line 2 is produced, and passes through a beam forming unit 3.

The unit 3 in conjunction with the focussing effects of a line image orientation and translation unit 4 produces a line image in the plane of an apertured plate 5. The beam or portion of the beam which passes through the aperture in the plate 5 is restored to its original orientation on the axis of the source by a unit 6 and then further orientated and directed as required by a unit 7 so as to impinge on a target 8.

Figure 5:
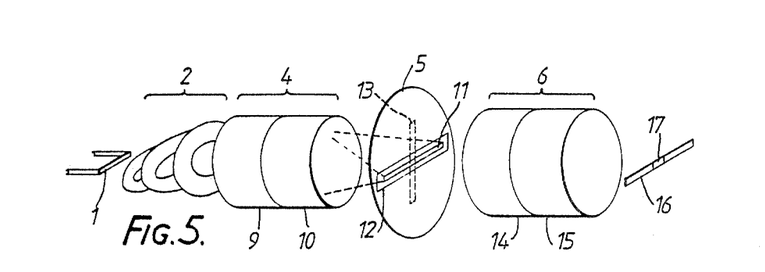
FIG. 5 is a diagram showing in more detail the example of FIG. 1.

FIG. 5 shows in more detail a particular example of the source constituted by the components 1, 3, 4, 5 and 6 of FIG. 1 in which the corresponding components have the same reference numbers as in FIG. 1. In FIG. 5 the line emitter 1 is an electric filament with a long narrow coating of lanthanum hexaboride or some other enhanced electron-emitting material. A flat beam of electrons is drawn from the emitter 1 by the accelerating elements 3, and the resulting beam is passed through two electromagnetic lenses 9 and 10 constituting the unit 4. The lenses 9 and 10 are of opposite polarity and their strengths are controlled, for example, by controlling the strength of an electric current applied to them to have a differential effect on the magnetic field strengths so that their total strength is constant but the difference between their strengths is adjustable by adjustment of the current. This current is additional to that applied to the lenses to produce the required focussing effect but no rotation of the line image. As is well known, a magnetic lens not only focusses a beam but also rotates it. Whilst the direction of rotation depends on the polarity of the magnetic field, the focussing effect depends only on the strength of the field. Thus, by making the combined strengths of the lenses 9 and 10 constant, a line image of the emitter 1 can be formed in the plane of the plate 5, but the orientation of that line image will depend on the relative strength of the differing polarity magnetic fields. The line image is represented in one position by the solid outline 11 and in another position by the dotted outline 13. The plate 5 has an aperture 12 in the form of a narrow rectangular slit. It will be apparent that when the line image is formed as shown as the outline 11, the whole length of the image can pass through the slit, whereas when the line image is disposed as shown as the outline 13, only a small section at its center can be passed through the slit, the outer parts being blocked by the material of the plate 5.

Figure 8:
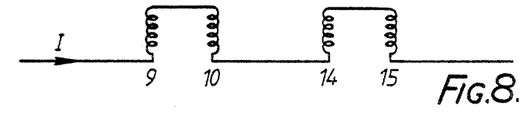
FIG. 8 shows a circuit arrangement for effecting the operation shown in FIG. 7, and which may also be used with line image rotation units as will be described with reference to FIG. 5.

The unit 6 performs the same function as the unit 4 but in the opposite sense; that is to say it reorientates the part of the line image which passes through the slot 12 to its original orientation, that is, parallel to the line emitter 1. Conveniently the unit 6 may have the same or a similar design and construction to the unit 4, and since the angle of rotation of the line image is to be the same in both cases, both units may be operated by the same current by wiring them in series, for example as shown in FIG. 8.

The output of the source shown in FIG. 5 is a line image 16 of the line emitter 1, the length of the image being determined by the orientation of the line image in the plane of the plate 5 relative to the slot 12. A much shorter line image 17 is produced when the line image on the plate 5 is substantially at right-angles to the length of the slot 12, and the image may be approximately a square spot if the slot 12 is sufficiently narrow.

Figure 6A:
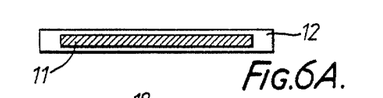
FIGS. 6A, 6B and 6C are diagrams to be used to explain the operation of the source shown in FIG. 5.
Figures 6B, 6C:
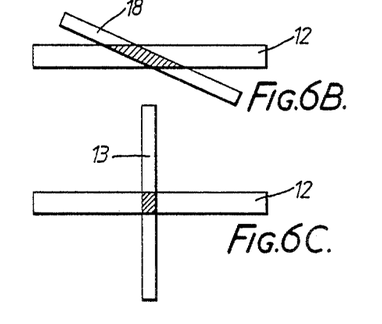

FIG. 6A shows the line image 11 lying wholly within the aperture of the slit 12, the image being shown shaded to indicate that the whole of the beam forming the image can pass through the slit 12. In FIG. 6C the line image 13 is shown at right-angles to the slit 12 so that only a small section at its center is shaded indicating that this section is all that passes through the slit 12. FIG. 6B shows the line image 18 at an intermediate angle in which just under half of the length of the line image can pass through the slit 12.

Figure 2:
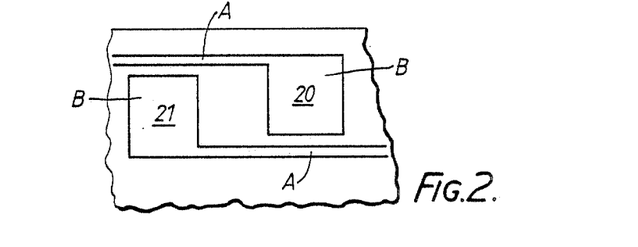
FIG. 2 is a diagram of part of an integrated circuit which could be used to describe how the source of FIG. 1 may be used.

FIG. 2 shows part of a hypothetical integrated circuit on which are shown two metallised areas 20 and 21. Each of the areas has a roughly square part and a long thin interconnection part In forming such areas on an integrated circuit a thin film of the metal is deposited over the entire surface of the circuit which has openings in an insulating film of, say, silicon dioxide to permit the metallisation to contact the surface of the semiconductor wafer in which the elements of the circuit are formed. The shaping of the metal film to the required pattern is effected by coating it with an electron beam-sensitive resist which is arranged to become insoluble in a particular solvent on exposure to electron beam bombardments. In order to produce the shaping shown in FIG. 2 it is necessary to bombard the resist in the areas where the metal is to be retained, i.e. 20 and 21, before removing the remainder of the resist by means of the solvent and then etching away the exposed metal. A short line image electron beam would be used for exposing the parts A of the region and a longer line image electron beam would be deflected boardside on to expose the parts B of the region. The use of a line source means that up to say 100 times the electron flow is available for bombarding the larger areas of the resist than would be available if a point source were used, which means that the processing time is correspondingly reduced. In practice it would probably be desirable to set the length of the line image electron beam to a required value and then expose all those parts of the resist which required that length to be used before changing the line image length to another value for exposing other parts of the resist. This is desirable because the magnetic lenses 9, 10, 14 and 15 would be unable to change their strengths rapidly without the use of excessive power because of their high inductances. A similar technique would be used with an ion source for implantation directly into a semiconductor wafer.

Although the use of the source shown in FIGS. 1 and 5 has been described in performing the electron beam exposure of a resist to produce the metallisation pattern on an integrated circuit, it could equally well be used for the exposure of a resist for opening windows in a protective film on the semiconductor material itself to permit the selective deposition or implantation of impurities on or in the semiconductor.

If the charged particle source were to produce a beam of ions instead of electrons, then the beam could be used directly as mentioned above to effect implantation of the impurities into the semiconductor material to produce the required semiconductor components. A suitable form of line emitter for ions would consist of a narrow angle wedge with an intense electric field in the vicinity of the edge of the wedge to draw from it the ions of the material to be deposited. The same rotation and translation system may be ions as for electrons, but either with a stronger magnetic field or the same electrostatic field, depending on which is used. The rotation and translation for changing the line length would be done at a low accelerating voltage to reduce the wattage dissipation at the shaping aperture. The full accelerating voltage would then be applied after the line formation.

Figure 7:
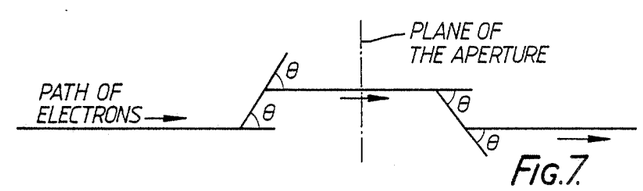
FIG. 7 is a diagram showing the operation of line image translation units suitable for use in FIG. 5.

As described above, rotation of the line image relative to a slit is used to define the length of the image which is passed for use. As an alternative or an addition to rotation, translation of the line image could be used in conjunction with a triangular or trapezoidal aperture. However, when deflection of the beam is used to effect the translation it should be followed by an equal and opposite deflection so that the translated beam is substantially parallel to its original path for its passage through the aperture. Again, as described above with reference to FIGS. 1 and 5, the part of the line image allowed to pass through the aperture should be translated back to the line of its original path before further deflection and/or rotation on the target. The geometry of the deflections before and after the aperture is shown in FIG. 7, and FIG. 8 shows how four deflection coils could be connected in series for operation by the same deflection current to implement the FIG. 7 geometry. Adjustment of the current I in FIG. 8 will adjust the amount of the translation and therefore the length of the line image allowed to pass through the aperture.

Instead of using magnetic deflection, it would be possible to use electrostatic deflection and the technique described with reference to FIG. 7 could be achieved by the use of four pairs of deflection plates to which the same deflection voltage is applied but in different senses depending upon the direction of deflection required. If the sense for the connection of the voltages to the first pair is designated as being +, then the connections would have the senses +,−,−,+.

Figure 1A:
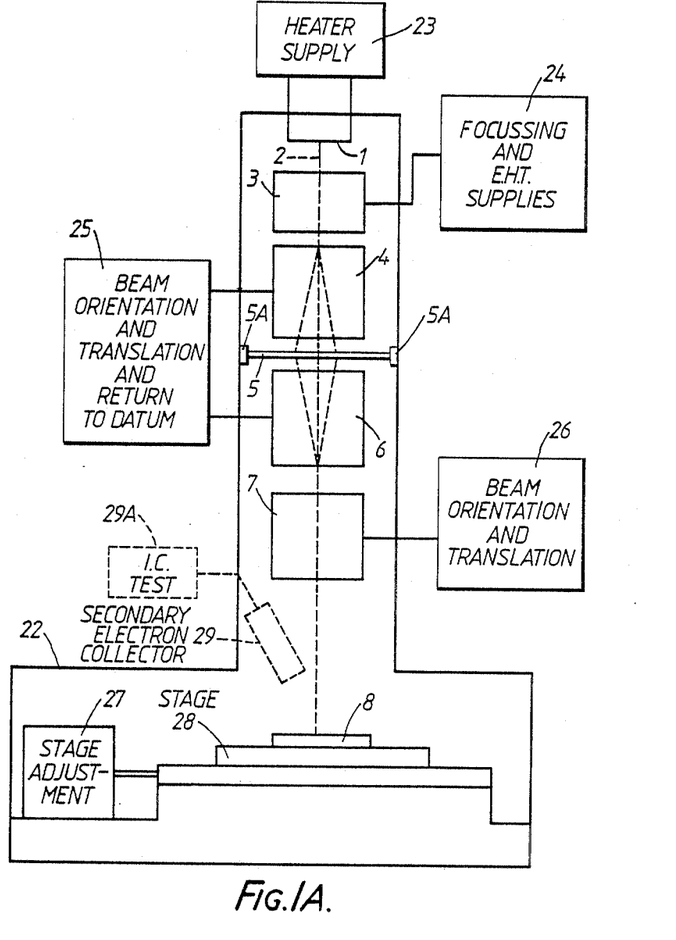
FIG. 1A shows the source of FIG. 1 in use in an integrated circuit processing or testing apparatus.

FIG. 1A shows an example of integrated circuit processing or testing apparatus using a source as described above with reference to FIG. 1 or FIG. 5. The parts of FIG. 1A which correspond to those of FIG. 1 carry the same reference numerals as in that Figure. The source shown in FIG. 1 is enclosed within an evacuated envelope 22 and has connected to it a heater supply 23 for heating the line emitter 1.

Focussing and EHT supplies 24 are connected to beam forming electrodes 3 and possibly also to other electrodes near the target 8 and to the target 8 itself. These latter means are not shown. The line image and orientation and translation unit 4 and the beam reorientation and translation unit 6 which are on opposite sides of the apertured plate 5 are energized by a single means 25 on the basis of the technique described above with reference to FIGS. 7 and 8 with the result that the beam is returned to its original line 2 along the axis of the source. For orientating the beam of the target 8 and providing the required translation of it there a means 26 supplies energization to the unit 7. The apertured plate 5 is mounted on supports 5A in such a way that plates having different apertures can be introduced into the apparatus. The target 8 which in one example of the apparatus of FIG. 1A is an integrated circuit is mounted on a stage 28 which is movable, preferably in two orthogonal directions by a stage adjustment unit 27.

The apparatus of FIG. 1A can be used for the processing of integrated circuits, for example by using an electron beam to expose selected areas of a resist or using an ion beam for the same purpose. Alternatively, if the source is arranged to produce an ion beam of a suitable material the apparatus can be used for selective ion beam implantation of a semiconductor body in the manufacture of an integrated circuit. For these purposes, the means 5 is controlled so as to produce the required length of line beam, and the means 26 is used to rotate the line of the beam and to translate it to required positions so that the beam impinges on the desired areas of the target 8. In an alternative arrangement the stage 28 is arranged to be movable in one direction only under automatic control with the line of the beam transverse to that direction and the control of the beam is linked to the stage movement and is such that the positions of both ends of the line are independently adjustable (e.g. by adjusting the length of the and the transverse position of a reference point of the line).

In another application of the apparatus of FIG. 1A, the charged particle beam is used to test the functioning of an integrated circuit while it is operating. It has been found that the energies of secondary electrons released from an integrated circuit when it is bombarded by an electron beam depend on the voltages of the parts of the circuit at the place where the beam strikes it, and therefore by the use of a suitable secondary electron collector the voltages occurring at different places on the circuit can be determined and the actual functioning of the circuit checked. This technique avoids the need for direct connection to normally inaccessible parts of the integrated circuit and the loading imposed in negligible despite the relatively small size of the current flowing in an integrated circuit during its operation. For the apparatus of FIG. 1A to be used for this purpose, it is provided with a secondary electron collector 29 connected to suitable test circuitry 29A, which components are shown in dotted line form in the Figure.

The units 3, 4, 6 and 7 of the source may be magnetic or electrostatic arrangements for influencing the beam or a mixture of both types of device.

Figure 9:
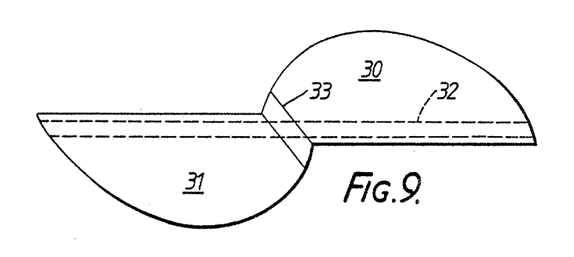
FIGS. 9, 10, 11 and 12 show alternative forms of aperture which could be used in conjunction with the examples of the invention shown in FIGS. 1 and 5.
Figures 10, 11:
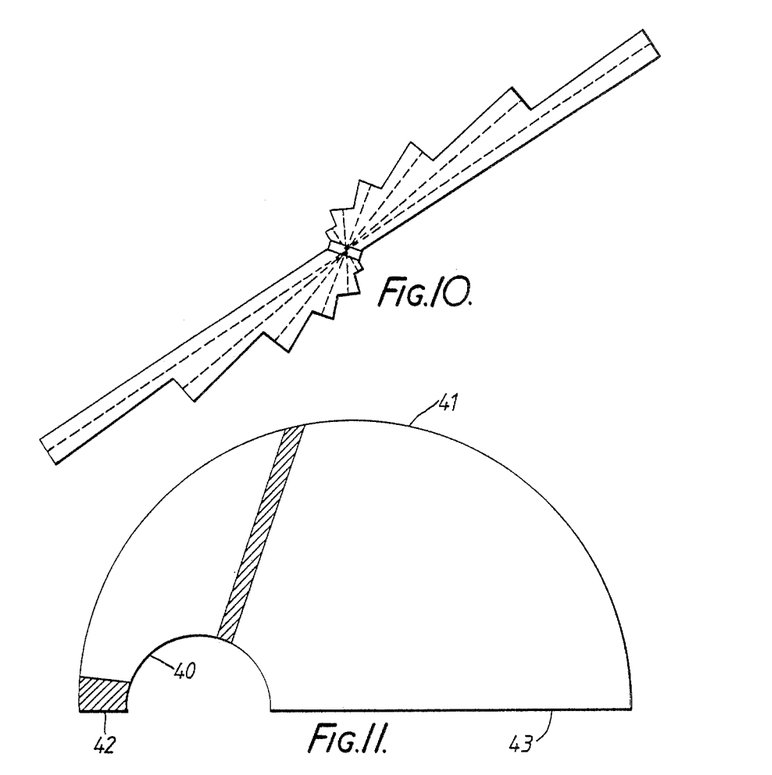

FIGS. 9, 10, 11 and 12 show alternative forms for the aperture in the plate 5 used to determine the width of the line image. In FIG. 9 the aperture consists of a slit with skew symmetrically disposed parts 30 and 31 having boundaries of approximately spiral outline. This form of aperture would permit the width of the line image to be adjusted from a maximum value as represented by the broken outline 32 to a minimum value represented by the solid outline 33 by rotation of the line image through an angle of about 135°. FIG. 10 shows a modification of the aperture shown in FIG. 9 in which instead of a smooth spiral outline a stepped outline is provided permitting the length of the line image to have any one of seven discrete values. In FIG. 11 the aperture is bounded by two semicircles 40 and 41 arranged eccentrically so that the width of a line image radial to the smaller semicircle 40 could be adjusted from a minimum value when it is adjacent to a straight portion 42 of the boundary and to a maximum value when it is adjacent to another straight portion 43 of the boundary. It follows that the line image must be subjected to rotation about a point off one end of it, but this could be achieved by the use of the double magnetic lens system described above with reference to FIG. 5.

Figure 12:
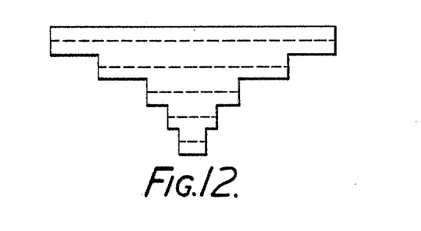

Translation of line image laterally would permit the determination of its length to be achieved by means of a trapezoidal aperture or a stepped trapezoidal aperture as is shown in FIG. 12. In addition, combinations of rotation and translation of the line image could used, in which case apertures of other shapes may be provided in the plage 5 to determine the length of the line image.

Figure 3:
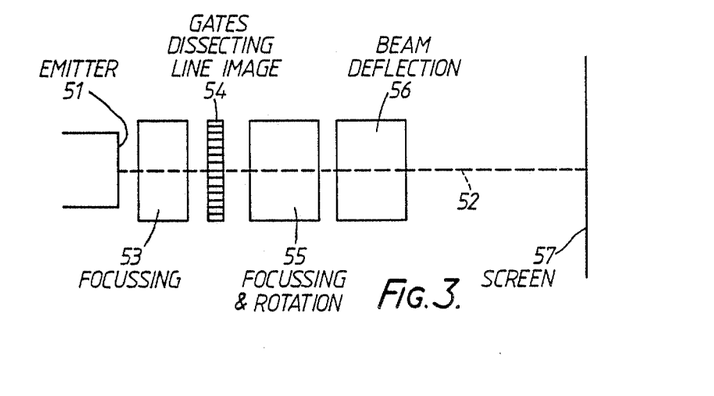
FIG. 3 is a diagram of another example of the invention used in a cathode ray display tube.

Although in the examples described above the plate 5 has a single shaped aperture, it would be possible for several apertures, possibly of differing shapes to be provided in plate 5 and for the positioning of the line image to be arranged to make use of a selected one of the apertures FIG. 3 shows another embodiment of the invention in which a line emitter 51 and the beam forming unit 53 produce a beam 52 of charged particles. However, instead of rotating and/or translating the line image and passing it through an aperture in a plate as described above, there is provided a line 54 of separately controllable gates. There may, for example, be between 10 and 20 such gates, each of which is able to block the passage of part of the line image through it when suitably energised.

Figure 4:
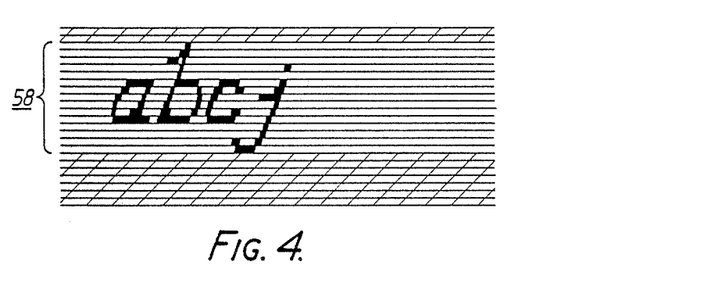
FIG. 4 shows an example of the kind of display which the cathode ray tube shown in FIG. 3 could produce.

The part of the beam allowed to pass by the gates 54 is refocussed onto the screen 57 and rotated to a required orientation by a focussing and rotation unit 55. The deflection of the beam to a required position on the screen 52 is effected by a unit 56. The rotation of the line image may be dispensed with so that when the beam 52 impinges on screen 57 there can be produced a display corresponding to selected ones of a set of adjacent lines of a raster. FIG. 4 shows an example of such a display in which the group of lines 58 corresponds to the gates 54. A display such as the group of lines shown in FIG. 4 could be produced by a single line deflection of the beam over the screen 57 with the individual gates 54 selectively operated to define the characters as the beam is deflected. This arrangement would enable the deflection rate of the beam to be reduced by a factor equal to the number of gates in the unit which would make quite possible very high-resolution displays without the need for excessively high video signal frequencies or very sensitive phosphors. In a modification of the arrangement shown in FIG. 3 the gates 54 are placed immediately adjacent to the line emitter 51, with the units 53 and 55 combined. This arrangement and that shown in FIG. 3 could also be used to work on integrated circuits as the other embodiments of the invention described above.

Figure 3A:
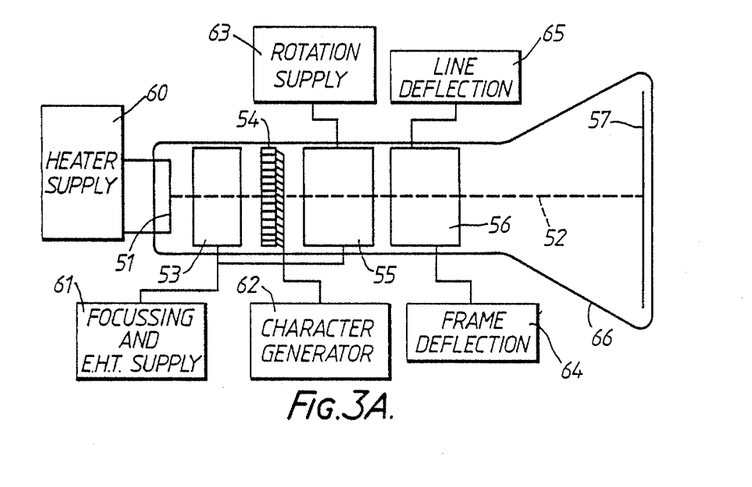
FIG. 3A shows an example of a display tube using the example of FIG. 3.

FIG. 3A shows a possible form of display tube using a source of the kind illustrated in FIG. 3. The elements of the source are contained within an evacuated envelope 66 and are connected to a heater supply 60 for energizing the line emitter 51, a focussing and EHT supply 61 for energizing the beam forming unit 53 and the focussing components of the focussing and rotation units 55. The character generator 62 is connected to the row of gates 54 for the purposes of producing a display such as is shown in FIG. 4. In alternative arrangements, the character generator 62 may be replaced by any other suitable source of digitized information so as to produce, for example, a drawing or other graphic display. A rotation supply 63 is connected to energize those components of the unit 55 which are concerned with rotation of the line beam and conventional frame and line deflection circuits 64 and 65 are connected to energize the unit 56.

Although in a conventional cathode ray tube the cathode produces a point beam of electrons, the tube shown in FIG. 3A may utilise a beam of ions as an alternative to a beam of electrons.

Although the source shown in FIG. 3 has been described in its application to a display device in FIG. 3A, it could also be used for integrated circuit processing and testing when used in apparatus of the kind shown in FIG. 1A.

Although the invention has been described with reference to a number of specific examples, it will be understood that it is not limited to those examples and modifications may be made to the examples as described without departing from the invention. For example, the aperture in the plate for blocking part of the line image may have other shpaes than those described. Indeed, the plate need not be a plate but may be replaced by tube of suitable cross-section or some other structure providing the required accurate delimitation of the line image is obtained. Instead of the magnetic lenses described for forming and orientating the line image, an electrode system providing an electrostatic field having a controllable amount of helical twist may be used or a combination of electrostatic and magnetic fields may be produced to achieve the same result.

I claim:

1. A source of charged particles including a line emitter for emitting the charged particles, the line emitter arranged transversely of the direction in which the charged particles are to be emitted; means for focusing the emitted particles into a flat beam which is a line image of the emitter; and beam shaping means including beam blocking means, the beam shaping means responsive to an applied electrical signal to block selectively one or more parts of the line image beam.

2. A source of charged particles including a line emitter for emitting the charged particles, the line emitter arranged transversely of the direction in which the charged particles are to be emitted; means for focusing the emitted particles into a flat beam which is a line image of the emitter; and beam shaping means comprising blocking means including a body of material impenetrable to the beam having a shaped aperture therethrough, and focusing and rotating means effective on the beam to change the orientation of the line image beam relative to the aperture in response to the applied electrical signal, the shaping of the aperture being such that changes in the orientation of the line image beam result in different lengths of the line image beam overlying the aperture so that the corresponding part of the beam can pass through the aperture; the source further including means for focusing the part of the beam passing through the aperture.

3. A source according to claim 2 wherein the means for focussing the part of the beam passing through the aperture includes second rotating means effective on the beam to restore its orientation to that of the line emitter.

4. A source according to claim 2 wherein the aperture has at least part of its periphery in the shape of a spiral.

5. A source according to claim 3 wherein the aperture is in the form of a slit with a skew symmetrical spiral periphery.

6. A source according to claim 4 wherein the aperture is in the form of a slit with a skew symmetrical stepped spiral periphery.

7. A source according to claim 2 wherein the focussing and twisting means includes two electromagnetic lenses of opposite polarity, having adjustable relative strengths but the same combined strength.

8. A source of charged particles including a line emitter for emitting the charged particles, the line emitter arranged transversely of the direction in which the charged particles are to be emitted; means for focusing the emitted particles into a flat beam which is a line image of the emitter; and beam shaping means comprising blocking means including a body of material impenetrable to the beam having one or more shaped aperture(s) therethrough, and focusing and translating means effective on the beam to change the position of the line image beam relative to the aperture(s) in response to the applied electrical signal, the shaping of the aperture(s) being such that changes in the position of the line image beam result in different lengths of the line image beam overlying the aperture so that the corresponding part(s) of the beam can pass through the aperture(s), and wherein the focusing and translating means includes two deflection means spaced apart along the beam which are adjustably energizable to deflect the beam through the same angle but in opposite senses.

9. A source according to claim 8 including two further deflection means effective at spaced positions along the beam after its passage through the shaped aperture(s), the further deflection means being energizable with the first-mentioned deflection means to deflect the beam through the same angle but in opposite senses, to restore the beam to its line before it was deflected by the first-mentioned deflecting means.

10. A source according to claim 8 wherein the deflection means are magnetic deflection coils connected in series.

11. A source according to claim 8 wherein the deflection means are pairs of electrostatic deflection plates connected in parallel.

12. A source according to claim 1 wherein the blocking means includes a line of discrete gate electrodes parallel to the line emitter or a line image beam produced therefrom, and means responsive to the applied electrical signal to cause selected ones of the gate electrodes to block the passage of the respective parts of the line image beam therethrough, and to cause the other gate electrodes to allow the passage of the respective parts of the beam therethrough.

13. A source according to claim 12 including means for focussing the parts of the beam allowed to pass through the line of gate electrodes.

14. A source according to claim 13, including means for rotating to a desired orientation the parts of the beam allowed to pass through the line of gate electrodes.

15. A source according to claim 1 wherein the line emitter comprises a block of single crystal electron emitting material, having a suitable crystallographic orientation and shaped to have an edge at which electron emission occurs.

16. A source according to claim 1 in which the line emitter emits ions and comprises a narrow angle wedge-shaped block of a suitable material with means for producing a powerful electric field in the vicinity of the edge of the block to extract ions therefrom.

17. Display apparatus having a charged particle responsive screen, a source of charged particles including a line emitter for emitting the charged particles, the line emitter arranged transversely of the direction in which the charged particles are to be emitted; means for forming the emitted particles into a flat beam which is a line image of the emitter; and means defining a charged particle penetrable aperture transverse of the direction of travel of the charged particle beam; and means for moving the line image beam in relation to the aperture to adjust the length of the line image beam passing through and emergent from the aperture; and means for scanning over the screen the part(s) of the line image beam that are emergent from the aperture in a direction transverse to the direction of emission of the charged particles from the line emitter.

18. A method of producing a beam of charged particles including the steps of energizing a line emitter of the charged particles disposed transversely of the intended direction of transmission of the charged particles, forming a beam which is a line image of the emitter at an aperture and rotating and/or translating the beam so that only a selected part of the line image beam length is incident on and passes through the aperture thereby to adjust the at least the length of the line image beam emergent from the aperture.

19. A method according to claim 18 in which the blocking means is a body with a shaped aperture through it, the method further including the step of rotating and/or translating the line image relative to the aperture to vary the length of the beam passing through the aperture.

20. A method according to claim 18 including the further step of rotating and/or translating the beam allowed to pass by the blocking means.

21. A source according to claim 15, wherein the electron emitting material is lanthanum hexaboride.

22. A source according to claim 2, wherein the line emitter comprises a narrow elongate strip.

23. A method according to claim 18, wherein the rotation and/or translation of the beam adjusts both the length and outline of the beam emergent from the aperture.

24. A method for patterning charged particle beam sensitive material including the steps of producing a beam of charged particles by energizing a line emitter of the charged particles disposed transversely of the intended direction of transmission of the charged particles, forming a beam which is a line image of the emitter at an aperture and rotating and/or translating the beam so that only a selected part of the line image beam length is incident on and passes through the aperture thereby to adjust the at least the length of the line image beam emergent from the aperture, focusing the emergent part of the line image beam on the sensitive material, and deflecting the focused line image beam over selected portions of the sensitive material to create the desired pattern.

25. A method according to claim 24, wherein the aperture is rectangular and the line image beam is rotated in a first sense relative to the aperture to adjust the length of the line image beam that is incident on and emergent from the aperture; and rotating the line image beam emergent from the aperture in an opposite sense to compensate for the initial orientation of the line image beam.

26. A source of charged particles including a line emitter for emitting the charged particles, the line emitter arranged transversely of the direction in which the charged particles are to be emitted; means for forming the emitted particles into a beam which is a line image of the emitter; means defining a charged particle penetrable aperture transverse of the direction of travel of the charged particle beam; and means for moving the line image beam in relation to the aperture to adjust the length of the line image beam passing through and emergent from the aperture.

27. A source according to claim 26, wherein movement of the line image beam in relation to the aperture by the beam moving means adjusts both the length and outline shape of the beam emergent from the aperture.

28. A source according to claim 26, wherein the beam moving means is for effecting at least rotation of the line image beam in relation to the aperture.

29. A source according to claim 26, wherein the beam moving means is for effecting at least translation of the beam in relation to the aperture.

30. a source according to claim 26, wherein the beam moving means is for effecting rotation and/or translation of the line image beam in relation to the aperture.

31. A source according to claim 26, including means for effecting movement of the line image beam emergent from the aperture in a sense to compensate for the movement of the initial movement of the line image beam.

32. A source according to claim 26, wherein the aperture is rectangular.

33. A source according to claim 32, wherein the rectangular aperture extends parallel to the line emitter.

34. A source according to claim 26, including first means for rotating and/or deflecting the part of the line image beam which passes through the aperture to a datum orientation and position and second means for rotating and/or deflecting the part of the line image beam which passes through the aperture to a required final orientation and/or position.

35. A source according to claim 26 including means for rotating and/or deflecting the part of the line image beam which passes through the aperture to a required final orientation and/or position, the means allowing for changes in the orientation and/or position of the line image beam produced by the rotating and/or deflecting means.

36. A source according to claim 26 wherein there is a single aperture which is trapezoidal in shape, and the line image beam is parallel to the parallel sides of the aperture.

37. A source according to claim 36 wherein the non-parallel sides of the aperture are straight.

38. A source according to claim 36 wherein the non-parallel sides of the aperture are stepped.

39. A source according to claim 22 wherein the line emitter is an electrically heated filament coated with lanthanum hexaboride.

* * * * *